(12) United States Patent
Ku et al.

(10) Patent No.: US 11,973,105 B2
(45) Date of Patent: Apr. 30, 2024

(54) EMBEDDED PRECISION RESISTOR FOR NON-PLANAR SEMICONDUCTOR DEVICE ARCHITECTURES

(71) Applicant: Intel Corporation, Santa Clara, CA (US)

(72) Inventors: Chieh-Jen Ku, Hillsboro, OR (US); Bernhard Sell, Portland, OR (US); Leif Paulson, Portland, OR (US); Kinyip Phoa, Beaverton, OR (US); Shi Liu, North Plains, OR (US)

(73) Assignee: Intel Corporation, Santa Clara, CA (US)

( * ) Notice: Subject to any disclaimer, the term of this patent is extended or adjusted under 35 U.S.C. 154(b) by 1420 days.

(21) Appl. No.: 16/145,111

(22) Filed: Sep. 27, 2018

(65) Prior Publication Data

US 2020/0105861 A1     Apr. 2, 2020

(51) Int. Cl.
  *H01L 23/522*  (2006.01)
  *H01L 27/01*   (2006.01)
  *H01L 49/02*   (2006.01)

(52) U.S. Cl.
  CPC .......... *H01L 28/24* (2013.01); *H01L 23/5228* (2013.01); *H01L 27/016* (2013.01)

(58) Field of Classification Search
  CPC .... H01L 28/24; H01L 23/5228; H01L 27/016
  See application file for complete search history.

(56) References Cited

U.S. PATENT DOCUMENTS

| | | | | |
|---|---|---|---|---|
| 8,765,490 B2* | 7/2014 | Zeng | ................ | H10N 50/10 365/158 |
| 8,847,187 B2* | 9/2014 | Tendulkar | ............ | H01L 28/24 438/102 |
| 8,860,181 B2* | 10/2014 | Wei | .................. | H01L 23/5228 257/536 |
| 2007/0117327 A1* | 5/2007 | Lee | ..................... | H01L 27/105 438/266 |

* cited by examiner

*Primary Examiner* — Dale E Page
*Assistant Examiner* — Abbigale A Boyle
(74) *Attorney, Agent, or Firm* — Schwabe, Williamson & Wyatt, P.C.

(57) ABSTRACT

An integrated circuit structure comprises at least one metal gate formed in a first dielectric layer, the at least one metal gate comprising a workfunction layer and the gate oxide layer along sidewalls of the first dielectric layer. A field effect (FE) dielectric layer dielectric layer is above the first dielectric layer of the at least one metal gate. A precision resistor comprising a thin-film metallic material is formed on the FE dielectric layer above the at least one metal gate and extending laterally over the at least one metal gate.

6 Claims, 13 Drawing Sheets

EMBEDDED PRECISION RESISTOR FOR NON-PLANAR SEMICONDUCTOR DEVICE ARCHITECTURES

TECHNICAL FIELD

Embodiments of the disclosure are in the field of integrated circuit structures and, in particular, embedded precision resistor for non-planar semiconductor device architectures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and state-of-the-art fabrication processes may limit the possibility to further extend them into the sub-10 nm range. Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1:
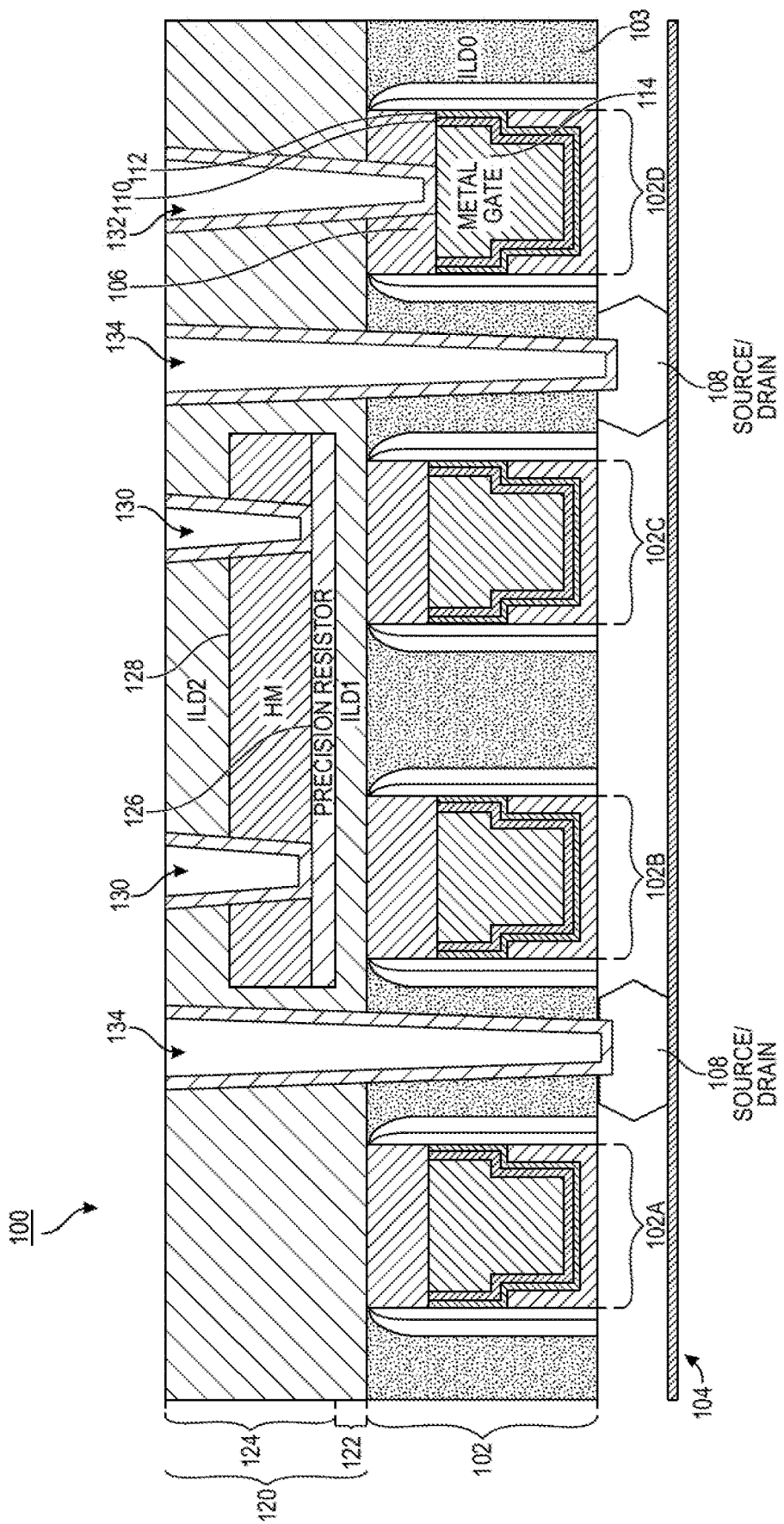
FIG. 1 is a cross-sectional view of an example four-gate, non-planar transistor having an embedded precision resistor in accordance with one embodiment of the disclosure.

Embedded precision resistor for non-planar semiconductor device architectures are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described below may be applicable to front-end-of-line (FEOL) processing and structures, back end of line (BEOL) processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to structures and architectures for fabricating embedded precision resistors (i.e., resistors that have a very low tolerance value) for non-planar semiconductor device architectures. Embodiments may include or pertain to one or more of thin film resistors, radio frequency integrated circuits (RFIC) and system-on-chip (SoC) technologies. One or more embodiments may provide thin film precision resistors to realize high performance RF functionality in Internet of Things (IOT) devices and/or in SoCs of future technology nodes.

Gate electrodes were initially formed from metal (e.g., aluminum). However, for many technology nodes, a Metal-Oxide-Semiconductor Field Effect Transistor (MOSFET) had included a gate electrode that was fabricated from polysilicon so as to permit ion implantation (e.g., to customize doping to N- or P-type in the same circuit) and silicidation (to reduce contact resistance). Consequently, a resistor associated with the MOSFET in a circuit was also fabricated with polysilicon. For example previous 22 nm SOC and current 14 nm SOC technologies include resistors made with polysilicon. As dimensions of the MOSFET continued to be scaled down in recent technology nodes, polysilicon depletion became an increasingly severe problem. As a result, gate electrodes are now being formed from metal again. In order to achieve desired work functions, the gate electrodes are now usually formed from a transition metal, an alloy of transition metals, or a transition metal nitride.

To enable RF functionality for integrated RFIC in future technology nodes, precision resistors play a critical role. RFIC is a resistor-heavy architecture using approximately 20-30% resistor area. In current technology nodes, precision resistors are made of polysilicon and may be referred to as a CPR resistor. The CPR resistors are doped with boron (B implantation) to control the final resistance value. For wireless technology, the value of the resistor and variation of the resistance is very important because it changes the functionality of the circuit. The problem with the polysilicon resistor is that it has a polycrystalline structure having a significant amount of grain, and the grain distribution cannot be controlled. In addition, when the polysilicon is doped, the boron undesirably segregates into the grain boundary. The dopant segregation in the grain boundary and random dopant fluctuation results in flicker noise and resistance mismatching ($\Delta R/R$). One way to meet RF performance requirements of low noise and low mismatching targets is to increase the total area of CPR resistors, e.g., by 10×. As a result, the total chip area cannot be reduced even if transistor dimensions continue to shrink.

In accordance with one or more embodiments, improved embedded precision resistors for non-planar semiconductor device architectures are described. The described embodiments embed a thin metallic film material in a dielectric above a metal gate(s) of a transistor to form a passive resistor device referred to as a thin-film precision resistor (TFR). In one embodiment, an integrated circuit structure is disclosed which comprises at least one metal gate formed in a first dielectric layer, where the metal gates comprise a workfunction layer and the gate oxide layer along sidewalls of the first dielectric layer. A field effect (FE) dielectric layer is above the first dielectric layer of the at least one metal gate. The TRF is formed on the FE dielectric layer above the at least one metal gate and extends laterally over the at least one metal gate.

A RF circuit fabricated using such an architecture may exhibit an increase in performance in the form of lower noise and lower mismatching while decreasing total resistor area. Embodiments described herein may include precision resistors for use with non-planar structures that are fully compatible with FEOL/BEOL processing. Resistor parameters are controlled by a deposition method such that the metallic thin film can meet temperature coefficients, sheet resistance and flicker noise requirements for RF integrated circuits.

FIG. 1 is a cross-sectional view of an example four-gate, non-planar transistor 100 having an embedded precision resistor in accordance with one embodiment of the disclosure. The four metal gates 102 of the non-planar transistor 100 are shown above a substrate 104 and formed in respective first dielectric layers 106, which are within a dielectric layer (ILD0) 103.

The four metal gates 102 include two outer metal gates 102A and 102D and two middle metal gates 102B and 102C. The four metal gates 102 each may comprise a work function layer 110 and gate oxide layer 112 formed along the bottom and sidewalls of the first dielectric layer 106, and a metal fill material 114 in between. The pair of middle metal gates 102B and 102C are flanked on either side by the first and second source/drains 108. More specifically, a first source/drain 108 is formed in-between outer metal gate 102A and middle metal gate 102B and a second source/drain 108 is formed in-between middle metal gates 102C and outer metal gate 102D.

A field effect (FE) inter-dielectric layer (ILD) 120 is formed over the first dielectric layers 106 of the four metal gates 106 and dielectric layer (ILD0) 103. In one embodiment, the FE ILD 120 comprises at least two dielectric layers, a bottom dielectric layer 122 (e.g., ILD1) formed over and in contact with the first dielectric layer 106 of the four metal gates 102, and a top dielectric layer 124 (e.g., ILD2) formed over bottom dielectric layer 122. Metal interconnects, not shown, may be formed above the FE ILD 120.

In accordance with the disclosed embodiments, a precision resistor 126 comprising a thin metallic film is embedded in top dielectric layer 124, and formed on bottom dielectric layer 122, over middle metal gates 102B and 102C. This is in contrast to a conventional polysilicon CPR, which was made part of the metal gate. Instead, the precision resistor 126 of the disclosed embodiments is formed by depositing a thin metallic layer over and on bottom dielectric layer 122 above middle metal gates 102B and 102C (i.e., the metal gates between the source/drains 108). In one embodiment, the length of the precision resistor is variable/adjustable. As used herein, the term "precision resistor" may be interchangeable used with the term "thin film precision resistor" or simply "thin film resistor" (TFR). By inserting a thin film of metallic material as the precision resistor 126 in the FE ILD layer 120, the resistor technology of the disclosed embodiments is fully compatible with integrated FEOL/BEOL processing. The resistor parameters are controlled by deposition method such that metallic thin film can meet temperature coefficient, sheet resistance and flicker noise.

A hardmask 128 is formed over and on the precision resistor 126 within the top dielectric layer 124. In one embodiment, the material comprising the hardmask is a nitride (hardmask 128 can be other dielectric materials such as oxide).

Connections with precision resistor 126 are made thru normal FE ILD contact processing by forming contacts through the FE ILD 120. A set of first and second gate contacts (GCNs) 130 are formed through the top dielectric layer 124 and the hardmask 128 of the FE ILD 120 in contact with the precision resistor 126, where the first and second GCNs 130 are aligned with the middle metal gates 102B and 102C, respectively. The thin film metallic material comprising the precision resistor 126 also act as the etch stop layer so that contact etch processing can always lands on precision resistor 126. In one embodiment, the GCNs 130 may have a depth of approximately 50 nm. Another gate contact 132 is formed through the FE ILD 120 and the first dielectric layer 106 in contact with the fourth metal gate 102D. Longer trench-shaped contacts (TCNs) 134 form electrical connections through the FE ILD 120 with the first and second source/drains 108, respectively.

In one embodiment, the metallic thin film used for the precision resistor 126 may be composed of titanium nitride. In another embodiment, the metallic thin film may be selected from the group comprising tungsten, tantalum, tantalum nitride, titanium, aluminum, and cobalt depending on the desired sheet resistance and thermal coefficient. As is well known, the properties and the performance of the thin film precision resistor 126 may be controlled by deposition techniques and its thickness and/or layout. In one embodiment, the precision resistor 126 may have a thickness of approximately 5-10 nm at 10 KΩ, for example. The precision resistor 126 may be formed by conventional techniques, such as, for example, chemical vapor deposition (CVD), physical vapor deposition (PVD), sputtering or by other deposition methods.

In one embodiment, the metal fill material 114 comprising the four metal gates 102 is selected from the group comprising metal nitrides, metal carbides, metal silicides, metal aluminides, hafnium, zirconium, tungsten, titanium, tantalum, aluminum, ruthenium, palladium, platinum, cobalt, nickel.

In one embodiment, the dielectric layers 106, 122 and 124 may comprise the same material. In another embodiment, one or more of the dielectric layers 106, 122 and 124 may comprise different materials. The dielectric layers 106, 122 and 124 may be composed of a material suitable to ultimately electrically isolate, or contribute to the isolation of, a permanent gate structure from the underlying substrate 104. For example, in one embodiment, the dielectric layers 106, 122 and 124 are selected from the group comprising, silicon dioxide, silicon oxy-nitride, silicon nitride, carbon-doped silicon nitride, various low-k dielectric materials known in the arts, and combinations thereof. It is to be understood that a global layer may be formed and then recessed to ultimately expose portions of the source/drains 108, the precision resistor 126, and the outer metal gate 102D. The dielectric materials may be formed by conventional techniques, such as, for example, CVD, PVD, or by other deposition methods.

The substrate 104 often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates.

As will become apparent, an additional mask is not needed to form the GCNs or TCNs. Accordingly, the precision resistor and the GCNs are made in the same fabrication step. This means that the precision resistor 126 may be fabricated without introducing additional processing steps required to fabricate the transistor 100.

Figure 2:
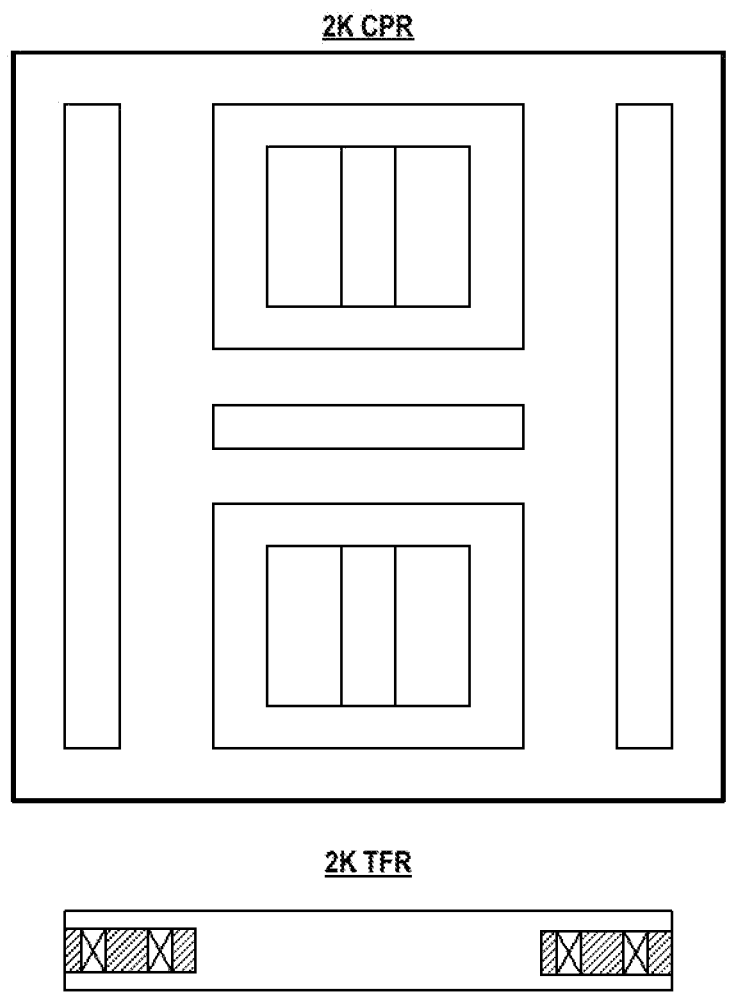
FIG. 2 illustrates the area benefit of a thin film precision resistor (TFR) compared to a conventional polysilicon resistor (CPR).
Figure 2:
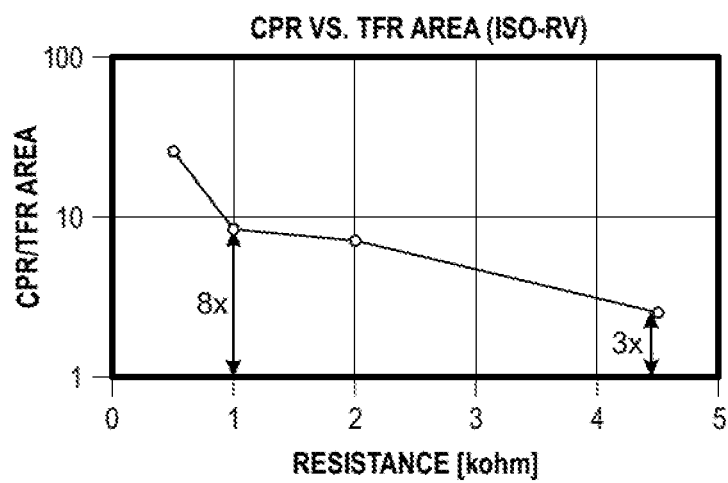

The precision resistor 126 of the disclosed embodiments offers high yield processing and provides an integrated solution to enable RF functionality for IOT products. The intrinsic advantage of metallic resistor materials over previous poly CPR resistors is that the TFR provides 3×-8× area reduction to meet RF performance requirements, as shown in FIG. 2. The simplified processing also enables layout flexibility and provides layout efficiency, as shown in FIGS. 3A-3D.

FIG. 2 illustrates the area benefit of a thin film precision resistor (TFR) compared to a conventional polysilicon resistor (CPR). On the top is a top view of a 2 kΩ CPR layout, which has a dimensions of 1.68×1.08 μm for a total area of 1.82 μm². In contrast, in the middle is a top view of a layout for a 2 kΩ TFR that has a dimensions of 180 nm×1.14 μm (effective channel length (LEFF)=0.9 μm) for a total area of 0.25 μm². On the bottom, a graph is shown plotting a ratio of CPR vs. TFR area over different resistance values. As the graph indicates, the TFR has 3-8× times lower area compared with the CPR over a resistance range of 1-5 kΩ, which covers more the 75% of resistors. This discrepancy in area size is due to the fact that CPRs have significant variation, which is defined by AR/R, and the only way to reduce the variation is to increase total resistance, which means increasing the total area of the CPR. This is not the case with the TFR of the present embodiments.

FIGS. 3A-3D illustrate the layout flexibility of the TFR by showing top views of example TFR layouts. Because of the nature of thin films, the TFR can be configured in any desired shape to improve layout deficiency and many different layout structures are possible including rectangular, zigzag, and round/oval, which is not possible with CPRs.

Figure 3A:
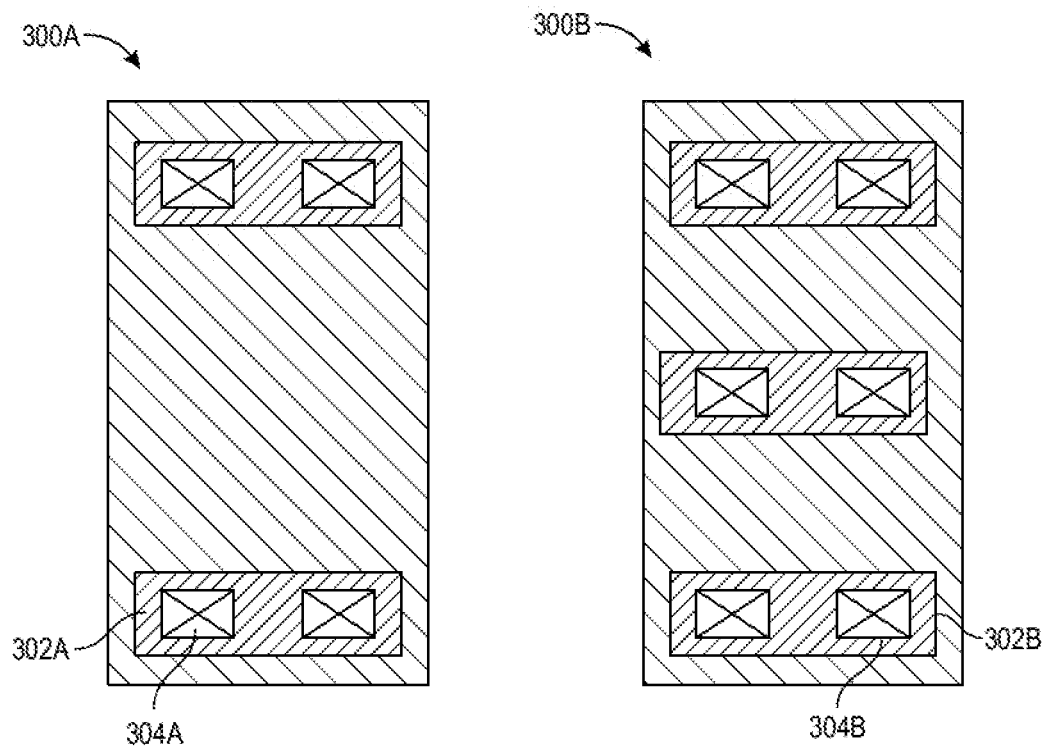
FIG. 3A illustrates examples of two rectangular TFRs.

FIG. 3A illustrates examples of two rectangular TFRs 300A and 300B, where TFR 300A has two GCNs 302A, while TFR 300B has three GCNs 302B. Each of the GCNs 302A and 302B is shown having two vias 304A and 304B. In one embodiment, a local density requirement for the TFR is that the TFR cannot be placed in transistor or tap areas that interferes with TCN/GCN device contacts.

Figure 3B:
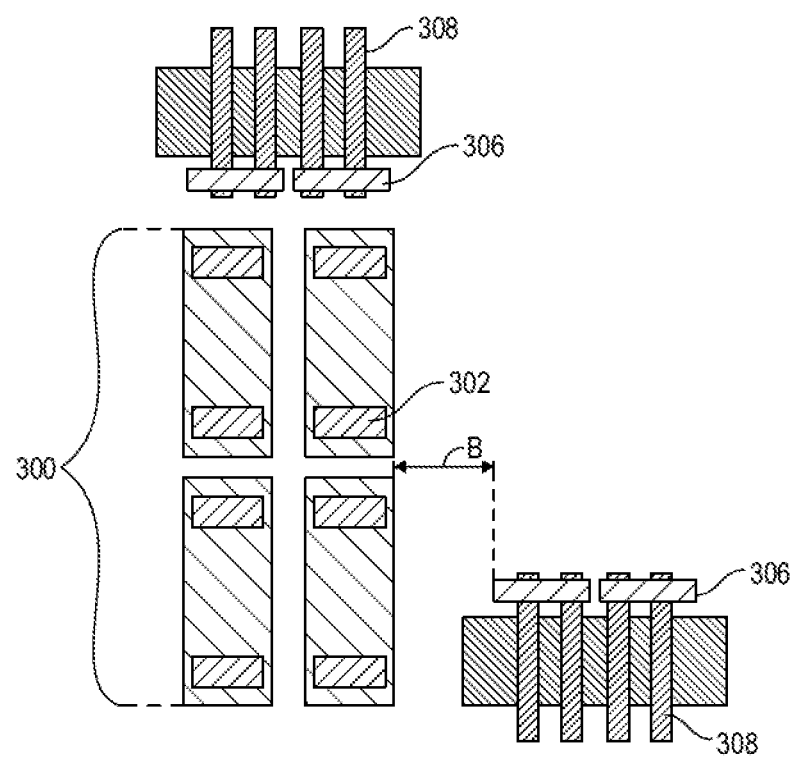
FIG. 3B illustrates an example layout showing that multiple TFRs may be used depending on the desired total resistance, e.g, 30 kΩ.

FIG. 3B illustrates an example layout showing that multiple, or in series, TFRs 300 may be used to provide increased total resistance greater than 30 kΩ. In this specific example, an array of four rectangular TFRs 300 is shown having TFR GCNs 302 adjacent to regular GCNs 306, which are coupled to polysilicon lines 308. This example shows the transition from TFR GCNs 302 to regular GCNs 306. Because of design rules, additional contacts or devices cannot be placed within a predefined area/distance (B) of a TFR GCN 302.

Figure 3C:
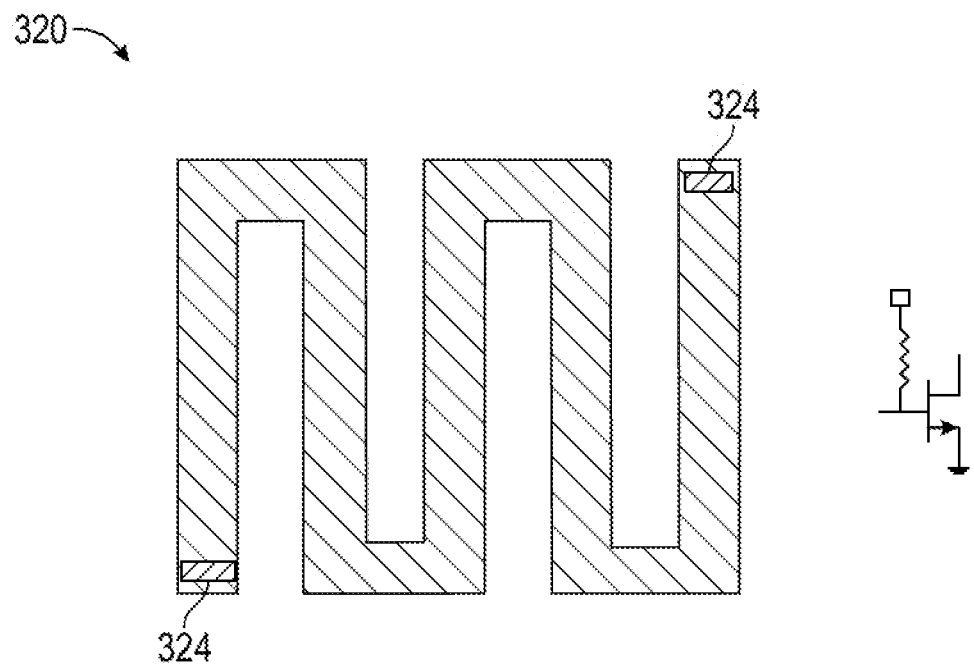
FIG. 3C shows an example of a zigzag TFR and an example circuit diagram.

FIG. 3C shows an example of a zigzag TFR 320 and an example circuit diagram thereof. The goal of the zigzag shape is to provide a large biasing resistor where variation is not a limiting factor and where capacitance is to be reduced. In one embodiment the zigzag TFR 320 has a resistance greater than 30 kΩ. Because long straight lines are not efficient to obtain high resistance, increased overall length is obtained in a predefined area by utilizing zigzag-shaped segments. The length/width ratio of the zigzag segments should be greater than 10, and the zigzag segments should have a spacing of at least 0.18 μm (180 nm) depending on the lithography technology. Two GCNs 324 are shown on tips of two end-segments.

Figure 3D:
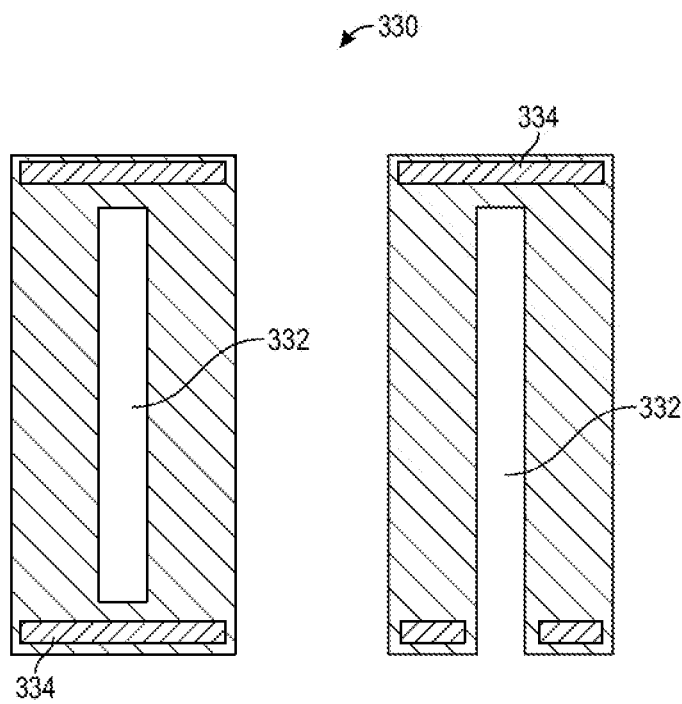
FIG. 3D shows two different embodiments of TFRs having jogs.

FIG. 3D shows two different embodiments of TFRs 330 having jogs. As used herein the term jog means that segments comprising the TFRs 330 form a hole area or jog 332. As in the previous embodiments, the TFR segments should have a spacing of at least 0.18 μm (180 nm) depending on the lithography technology. GCNs 330 of various sizes and placements are also shown.

FIGS. 4A-4D illustrates cross-sectional views of the process for fabricating the TFR or precision resistor in accordance with one embodiment of the present disclosure, where like components from FIG. 1 have like reference numerals. The process assumes that the underlying gates and source/drains have already been fabricated. Although a four gate transistor will be described, the precision resistor may be used with any non-planar transistor.

Figure 4A:
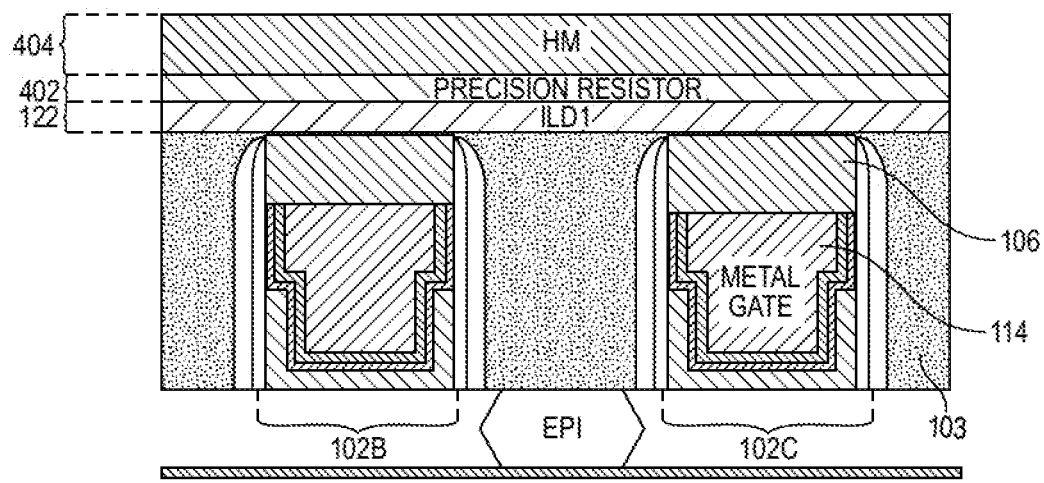
FIGS. 4A-4D illustrates cross-sectional views of the process for fabricating the TFR in accordance with one embodiment of the present disclosure, where like components from FIG. 1 have like reference numerals.

FIG. 4A illustrates the fabrication process after precision resistor film stack deposition. First, a bottom dielectric layer (ILD1) 122 is blanket deposited over a first dielectric layer 106 of the metal gates 102. A metallic thin film material 402 is then blanket deposited over the bottom dielectric layer 103, followed by a blanket deposit of a hardmask material layer 404 over the metallic thin film material 402.

Figure 4B:
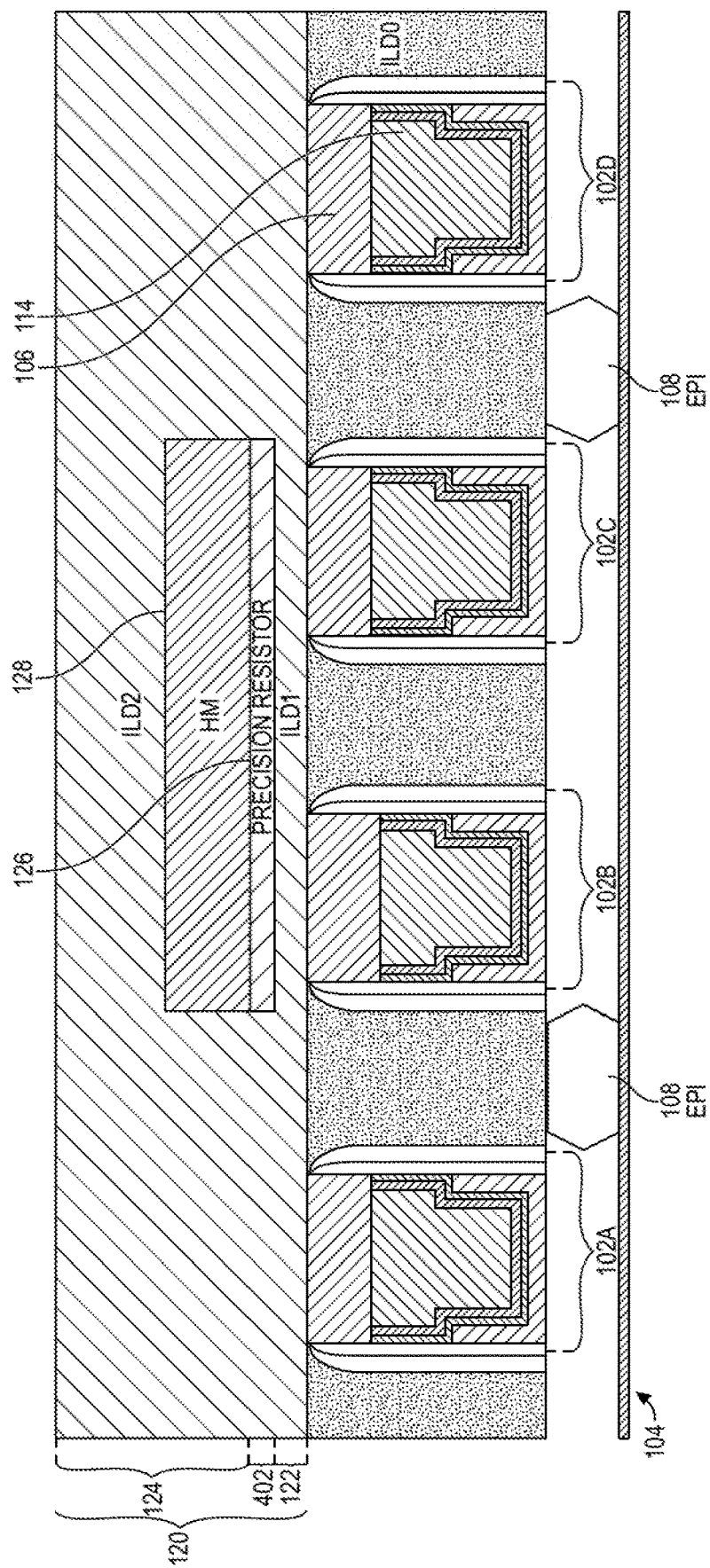

FIG. 4B illustrates the fabrication process after the precision resistor film stack and the hardmask material 128 are patterned through lithography and etching to form the precision resistor 126 and the hardmask 128 over the bottom dielectric layer 122. Thereafter, a top dielectric layer (ILD2) 124 is blanket deposited over the bottom dielectric layer (ILD1) 122 and over the hardmask 128 to complete the multi-layer FE ILD 120. The hardmask 128 and the precision resistor 126 are aligned over the two middle metal gates, marked in the X-direction and the Y-direction to reduce the possibility of misalignment.

Figure 4C:
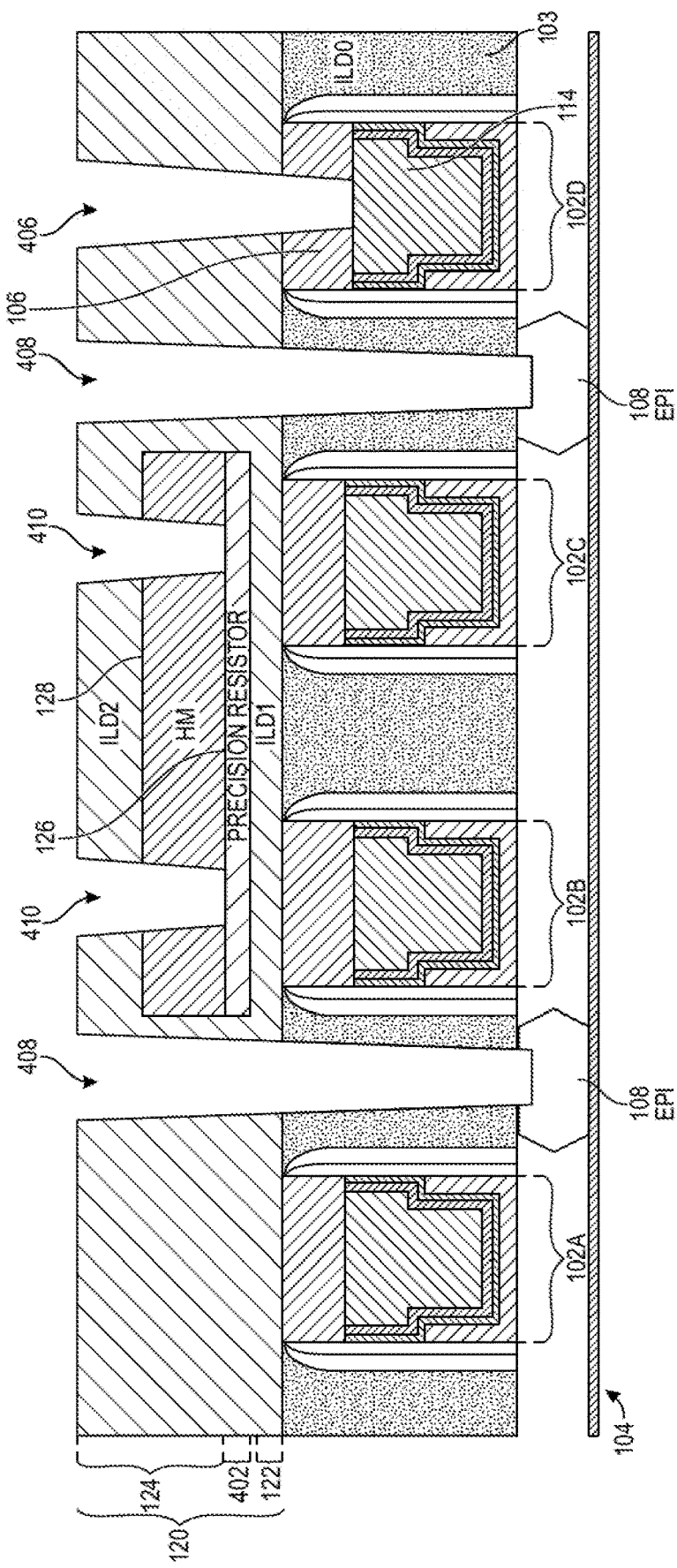

FIG. 4C illustrates the fabrication process after precision resistor contact patterning. According to one aspect of the present embodiments, contact patterning is performed using single contact mask (not shown), thus reducing costs since there is no need for an additional contact mask. First, contact holes 408 for trench-shaped contacts (TCNs) over the first and second source/drains 108 are made by etching through the top dielectric layer (ILD2) 124, the bottom dielectric layer (ILD1) 122, and the dielectric layer (ILD0) 103. The TCNs are then covered with a polymer hardmask prior to a TFR and gate contact lithographic patterning/etch process. According to a further aspect, because the metallic thin film of the precision resistor 126 is a very good etch stop layer, contact holes 406 for the gate contacts (GCNs) may be etched at the same time as contact holes 410 for the TFR contacts (TFRCNs). Contact holes 410 for the TFRCNs over the precision resistor 126 are performed by etching through the top dielectric layer (ILD2) 124 and the hardmask 128 of the FE ILD 120. In one embodiment, a dry etch that is capable of etching both an oxide of the top dielectric layer 124 and a nitride of the hardmask 128 is used to form contact holes 410. The etch is controlled by time, but because the etch for the contact holes 410 of the TFRCNs will stop on the precision resistor 126, there are no ramifications of etching until the contact holes 406 for the GCNs reach the metal gate material 114.

Figure 4D:
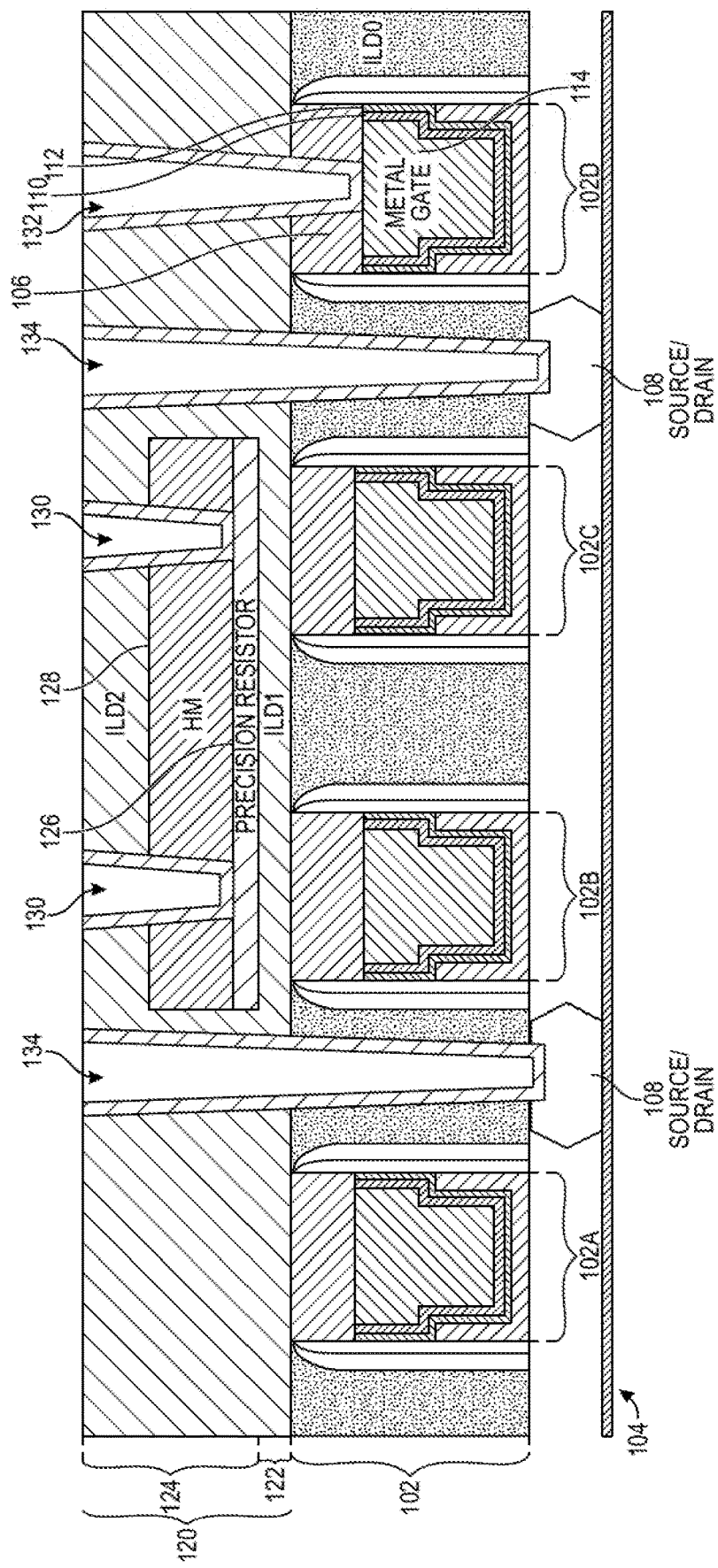

FIG. 4D illustrates a continuation of precision resistor contact patterning. During this process, the contact holes 406 and 408 are optionally lined with a line or material 410 and then filled with a metal material 412 such as tungsten, and polished to the top surface of the FE ILD 120 to complete formation of the GCNs 130 and 132 and TCNs 134.

The above process results in a precision resistor 126 suitable for the resistor-heavy architecture having a 20-30% resistor area. The precision resistor 126 is capable of flexible resistor layouts, allowing the requirements for RFIC layout efficiency to be met. The wide range of precision resistor material selection required for design optimization. The low mismatching/flicker noise of the precision resistor 126 is also suitable for RFIC performance and area scaling. Further, the low parasitic capacitance for performance of the precision resistor 126 also meets RFIC requirements.

Figure 5A:
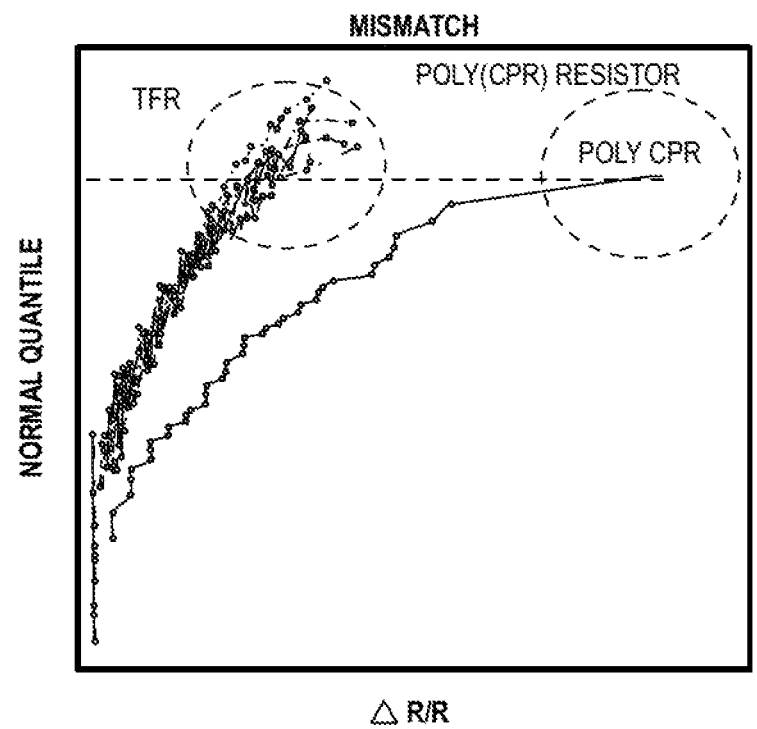
FIGS. 5A-5C are distribution charts illustrating advantages of the TFR over a conventional poly CPR resistor.
Figure 5B:
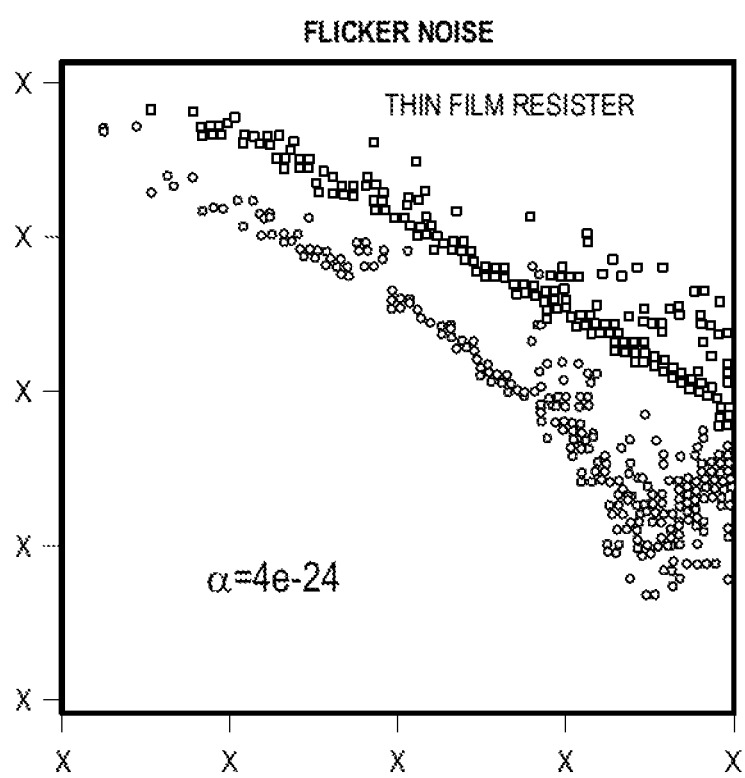
Figure 5B:
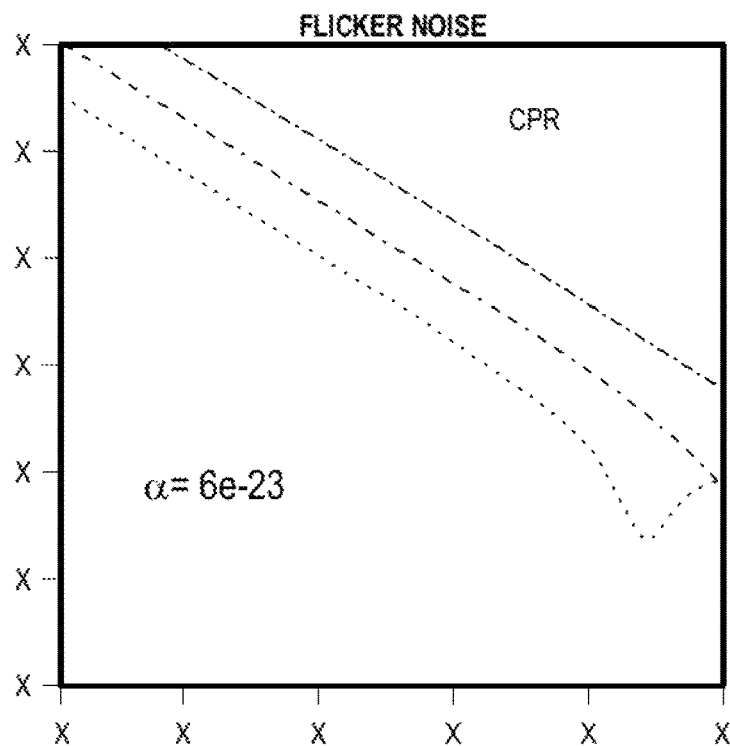
Figure 5C:
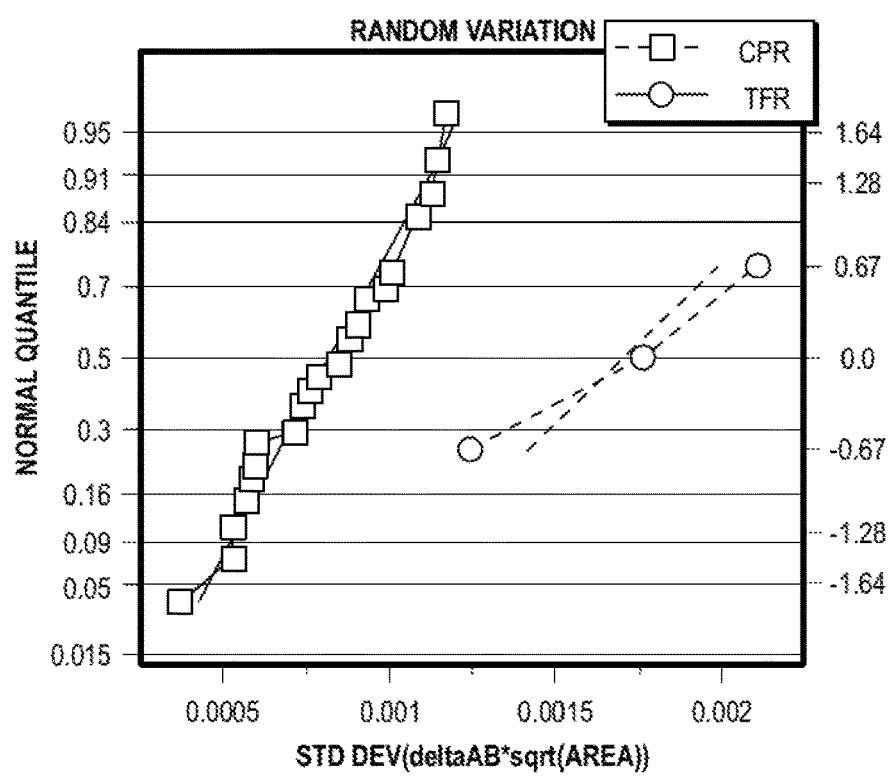

FIGS. 5A-5C are distribution charts further illustrating advantages of the precision resistor or TFR over a conventional poly CPR resistor. FIG. 5A shows distributions of mismatch values for various thicknesses of the TFR versus the CPR, where each thickness of a TiN TFR has a final resistance target. The Y-axis is normal quantiles, while the X-axis is mismatch measured by AR/R, which is the resistance difference between the TFR and CPR divided by a target resistance. Ideally, the distributions showing the mismatch should be as a narrow as possible and be closest to the X-axis as possible. The distribution for the CPR slopes severely to the right, indicating significant mismatch. Conversely, the distributions for the different thicknesses of the TiN TFR remain closer to the X-axis, indicating significantly reduced mismatch than the CPR.

FIG. 5B shows two distribution charts of flicker noise values for various thicknesses of the TFR versus the CPR. The top chart represents flicker noise for a TiN TFR measured at two different currents, 3 milliamps (top curve) and 5 milliamps (bottom curve). The bottom chart represents flicker noise for a CPR measured at three different current levels. Noise is defined by an alpha ($\alpha$) coefficient, which is measured by the slope of each curve. Ideally, the value for flicker noise should be as low as possible. Alpha for the TFR is 4 e-24, while alpha for CPR is 6 e-23. Thus, flicker noise for the TFR is 10× to 15× lower than for the CPR resistor.

FIG. 5C shows distribution chart values for measured random variation for different layouts of the TFR versus the CPR. The Y-axis is normal quantiles, while the X-axis is standard deviation of random variation or noise for a given resistor area. The chart shows the change in random variation of resistance with the change in area. The result of a significant variation means negative performance for RFIC communications. If random variation is low, then less layout area can be used. The charts shows significantly less random variation for the TFR than for the CPR even though the resistor areas for the TFR are smaller than the CPR, meaning that the total area for the circuit can be reduced.

The integrated circuit structures described herein may be included in an electronic device. As an example of one such apparatus, FIGS. 6A and 6B are top views of a wafer and dies that include one or more thin film embedded precision resistors, in accordance with one or more of the embodiments disclosed herein.

Figure 6B:
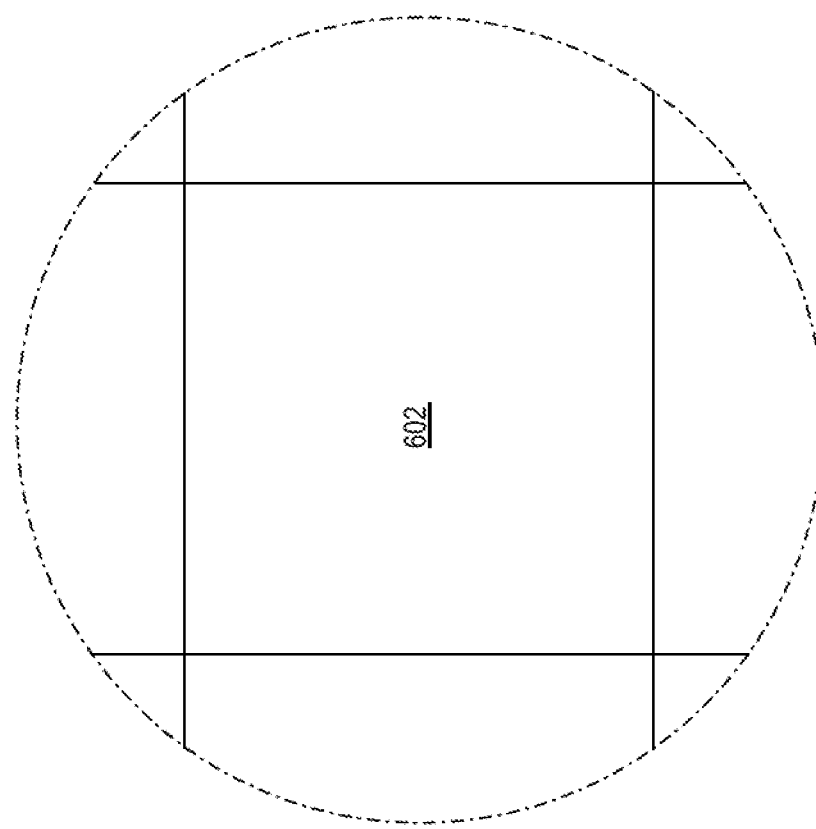
FIGS. 6A and 6B are top views of a wafer and dies that include one or more thin film embedded precision resistors, in accordance with one or more of the embodiments disclosed herein.
Figure 6A:
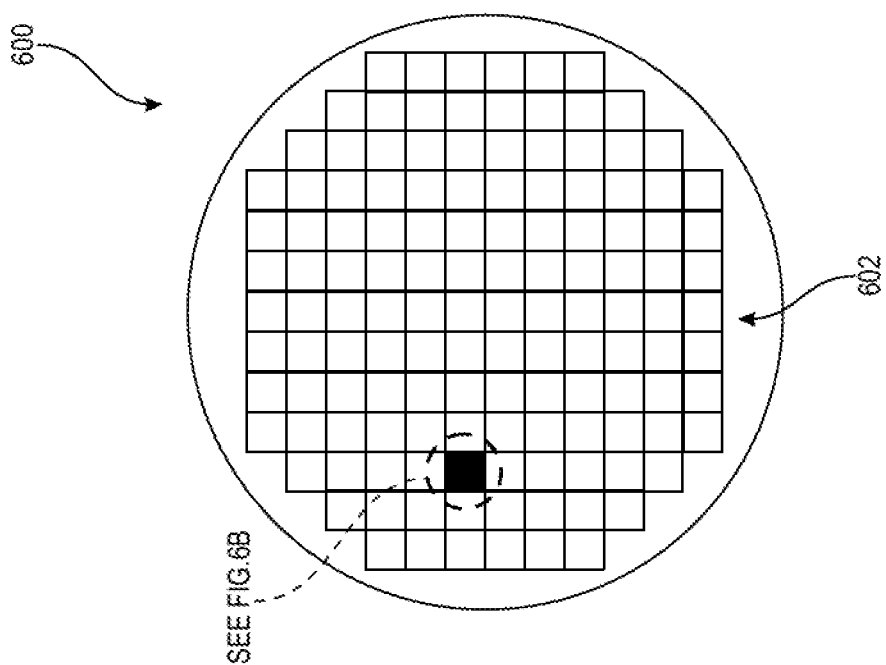

Referring to FIGS. 6A and 6B, a wafer 600 may be composed of semiconductor material and may include one or more dies 602 having integrated circuit (IC) structures formed on a surface of the wafer 600. Each of the dies 602 may be a repeating unit of a semiconductor product that includes any suitable IC (e.g., ICs including one or more thin film embedded precision resistors, such as described above. After the fabrication of the semiconductor product is complete, the wafer 600 may undergo a singulation process in which each of the dies 602 is separated from one another to provide discrete "chips" of the semiconductor product. In particular, structures that include embedded non-volatile memory structures having an independently scaled selector as disclosed herein may take the form of the wafer 600 (e.g., not singulated) or the form of the die 602 (e.g., singulated). The die 602 may include one or more embedded non-volatile memory structures based independently scaled selectors and/or supporting circuitry to route electrical signals, as well as any other IC components. In some embodiments, the wafer 600 or the die 602 may include an additional memory device (e.g., a static random access memory (SRAM) device), a logic device (e.g., an AND, OR, NAND, or NOR gate), or any other suitable circuit element. Multiple ones of these devices may be combined on a single die 602. For example, a memory array formed by multiple memory devices may be formed on a same die 602 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 7:
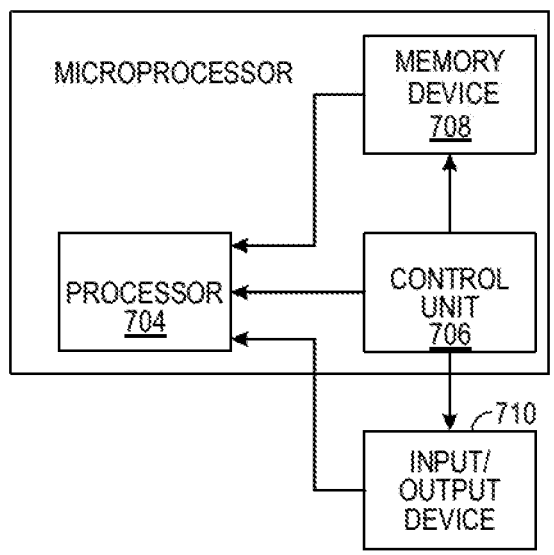
FIG. 7 illustrates a block diagram of an electronic system, in accordance with an embodiment of the present disclosure.

FIG. 7 illustrates a block diagram of an electronic system 700, in accordance with an embodiment of the present disclosure. The electronic system 700 can correspond to, for example, a portable system, a computer system, a process control system, or any other system that utilizes a processor and an associated memory. The electronic system 700 may include a microprocessor 702 (having a processor 704 and control unit 706), a memory device 708, and an input/output device 710 (it is to be appreciated that the electronic system 700 may have a plurality of processors, control units, memory device units and/or input/output devices in various embodiments). In one embodiment, the electronic system 700 has a set of instructions that define operations which are to be performed on data by the processor 704, as well as, other transactions between the processor 704, the memory device 708, and the input/output device 710. The control unit 706 coordinates the operations of the processor 704, the memory device 708 and the input/output device 710 by cycling through a set of operations that cause instructions to be retrieved from the memory device 708 and executed. The memory device 708 can include a non-volatile memory cell as described in the present description. In an embodiment, the memory device 708 is embedded in the microprocessor 702, as depicted in FIG. 7. In an embodiment, the processor 704, or another component of electronic system 700, includes one or more thin film embedded precision resistors, such as those described herein.

Figure 8:
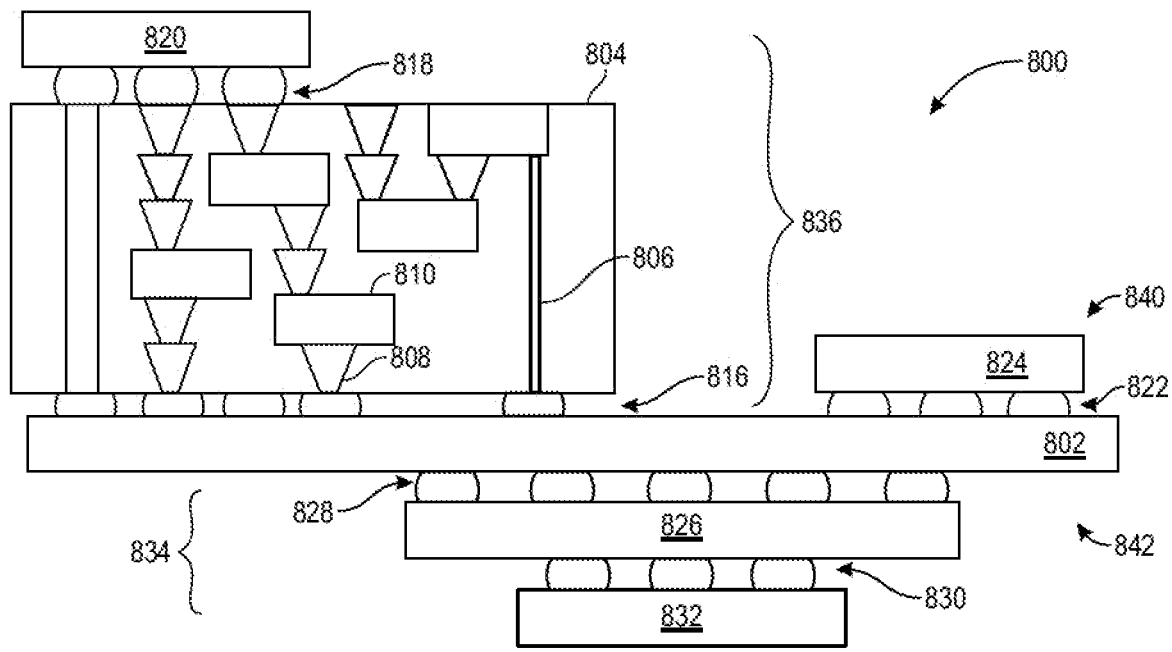
FIG. 8 is a cross-sectional side view of an integrated circuit (IC) device assembly that may include one or more thin film embedded precision resistors, in accordance with one or more of the embodiments disclosed herein.

FIG. 8 is a cross-sectional side view of an integrated circuit (IC) device assembly that may include one or more thin film embedded precision resistors, in accordance with one or more of the embodiments disclosed herein.

Referring to FIG. 8, an IC device assembly 800 includes components having one or more integrated circuit structures described herein. The IC device assembly 800 includes a number of components disposed on a circuit board 802 (which may be, e.g., a motherboard). The IC device assembly 800 includes components disposed on a first face 840 of the circuit board 802 and an opposing second face 842 of the circuit board 802. Generally, components may be disposed on one or both faces 840 and 842. In particular, any suitable ones of the components of the IC device assembly 800 may include a number of thin film embedded precision resistors, such as disclosed herein.

In some embodiments, the circuit board 802 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 802. In other embodiments, the circuit board 802 may be a non-PCB substrate.

The IC device assembly 800 illustrated in FIG. 8 includes a package-on-interposer structure 836 coupled to the first face 840 of the circuit board 802 by coupling components 816. The coupling components 816 may electrically and mechanically couple the package-on-interposer structure 836 to the circuit board 802, and may include solder balls (as shown in FIG. 8), male and female portions of a socket, an adhesive, an underfill material, and/or any other suitable electrical and/or mechanical coupling structure.

The package-on-interposer structure 836 may include an IC package 820 coupled to an interposer 804 by coupling components 818. The coupling components 818 may take any suitable form for the application, such as the forms discussed above with reference to the coupling components 816. Although a single IC package 820 is shown in FIG. 8, multiple IC packages may be coupled to the interposer 804. It is to be appreciated that additional interposers may be coupled to the interposer 804. The interposer 804 may provide an intervening substrate used to bridge the circuit board 802 and the IC package 820. The IC package 820 may be or include, for example, a die (the die 702 of FIG. 7B), or any other suitable component. Generally, the interposer 804 may spread a connection to a wider pitch or reroute a connection to a different connection. For example, the interposer 804 may couple the IC package 820 (e.g., a die) to a ball grid array (BGA) of the coupling components 816 for coupling to the circuit board 802. In the embodiment illustrated in FIG. 8, the IC package 820 and the circuit board 802 are attached to opposing sides of the interposer 804. In other embodiments, the IC package 820 and the circuit board 802 may be attached to a same side of the interposer 804. In some embodiments, three or more components may be interconnected by way of the interposer 804.

The interposer 804 may be formed of an epoxy resin, a fiberglass-reinforced epoxy resin, a ceramic material, or a polymer material such as polyimide. In some implementations, the interposer 804 may be formed of alternate rigid or flexible materials that may include the same materials described above for use in a semiconductor substrate, such as silicon, germanium, and other group III-V and group IV materials. The interposer 804 may include metal interconnects 810 and vias 808, including but not limited to through-silicon vias (TSVs) 806. The interposer 804 may further include embedded devices, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 804. The package-on-interposer structure 836 may take the form of any of the package-on-interposer structures known in the art.

The IC device assembly 800 may include an IC package 824 coupled to the first face 840 of the circuit board 802 by coupling components 822. The coupling components 822 may take the form of any of the embodiments discussed above with reference to the coupling components 816, and the IC package 824 may take the form of any of the embodiments discussed above with reference to the IC package 820.

The IC device assembly 800 illustrated in FIG. 8 includes a package-on-package structure 834 coupled to the second face 842 of the circuit board 802 by coupling components 828. The package-on-package structure 834 may include an IC package 826 and an IC package 832 coupled together by coupling components 830 such that the IC package 826 is disposed between the circuit board 802 and the IC package 832. The coupling components 828 and 830 may take the form of any of the embodiments of the coupling components 816 discussed above, and the IC packages 826 and 832 may take the form of any of the embodiments of the IC package 820 discussed above. The package-on-package structure 834 may be configured in accordance with any of the package-on-package structures known in the art.

Figure 9:
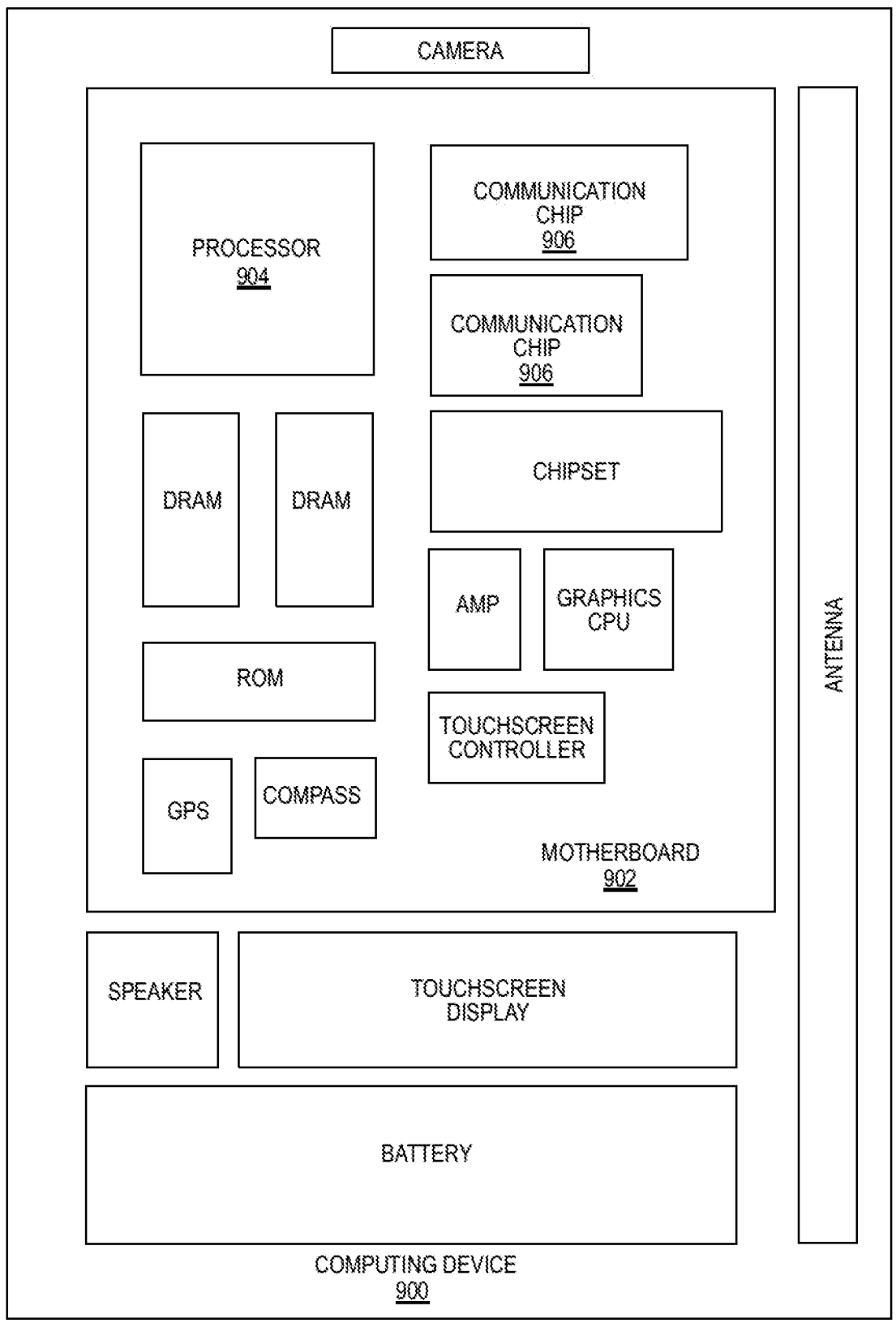
FIG. 9 illustrates a computing device in accordance with one implementation of the disclosure.

FIG. 9 illustrates a computing device 900 in accordance with one implementation of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the disclosure, the integrated circuit die of the processor includes one or more thin film embedded precision resistors, in accordance with implementations of embodiments of the disclosure. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of embodiments of the disclosure, the integrated circuit die of the communication chip includes one or more thin film embedded precision resistors, in accordance with implementations of embodiments of the disclosure.

In further implementations, another component housed within the computing device 900 may contain an integrated circuit die that includes one or more thin film embedded precision resistors, in accordance with implementations of embodiments of the disclosure.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Thus, embodiments described herein include precision resistor for non-planar semiconductor device architectures. The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure comprises at least one metal gate formed in a first dielectric layer, the at least one metal gate comprising a workfunction layer and the gate oxide layer along sidewalls of the first dielectric layer. A field effect (FE) dielectric layer is above the first dielectric layer of the at least one metal gate. A precision resistor comprising a thin-film metallic material is formed on the FE dielectric layer above the at least one metal gate and extending laterally over the at least one metal gate.

Example embodiment 2: The integrated circuit structure of example embodiment 1, wherein the thin-film metallic material comprises titanium nitride.

Example embodiment 3: The integrated circuit structure of example embodiment 1, wherein the thin-film metallic material is selected from the group comprising tungsten, tantalum, tantalum nitride, titanium, aluminum, and cobalt.

Example embodiment 4: The integrated circuit structure of example embodiment 1, 2 or 3, wherein the precision resistor has a thickness of approximately 5-10 nm.

Example embodiment 5: The integrated circuit structure of example embodiment 1, 2, 3 or 4, wherein a layout of precision resistor has a zigzag shape to increase overall length.

Example embodiment 6: The integrated circuit structure of example embodiment 1, 2, 3 or 4, wherein a layout of precision resistor has at least one of rectangular and round/oval shape.

Example embodiment 7: The integrated circuit structure of example embodiment 1, 2, 3, 4, 5 or 6, further comprising multiple precision resistors to provide increased total resistance greater than 30 kΩ.

Example embodiment 8: The integrated circuit structure of example embodiment 1, 2, 3, 4, 5, 6 or 7, further comprising a hardmask over and on the precision resistor.

Example embodiment 9: The integrated circuit structure of example embodiment 1, 2, 3, 4, 5, 6, 7 or 8, further comprising a first gate contact formed through the FE dielectric layer in contact with the precision resistor.

Example embodiment 10: The integrated circuit structure of example embodiment 9, wherein the at least one metal gate comprises a first metal gate and a second metal gate, the integrated circuit structure further comprising: a second gate contact formed through the second dielectric layer in contact with the precision resistor, wherein the first gate contact is aligned with the first metal gate and the second gate contact is aligned with the second metal gate.

Example embodiment 11: The integrated circuit structure of example embodiment 10, further comprising: a first source/drain on an outside of the first metal gate and a second source/drain formed on an outside of the second metal gate.

Example embodiment 12: The integrated circuit structure of example embodiment 11, further comprising first and second trench-shaped contacts (TCNs) formed through the second dielectric layer in contact with the first source/drain and the second source/drain, respectively.

Example embodiment 13: The integrated circuit structure of example embodiment 1, 2, 3, 4, 5, 6, 7, 8, 9, 10, 11 or 12, the FE dielectric layer comprises at least two dielectric layers, a bottom dielectric layer formed over and in contact with the first dielectric layer of the at least one metal gate, and a top dielectric layer formed over the bottom dielectric layer.

Example embodiment 14: The integrated circuit structure of example embodiment 13, wherein the precision resistor is formed over and on the bottom dielectric layer.

Example embodiment 15: The integrated circuit structure of example embodiment 13 or 14, further comprising a hardmask within the FE dielectric layer formed over and on the precision resistor.

Example embodiment 16: An integrated circuit structure comprises a non-planar transistor having four metal gates above a substrate and formed in a first dielectric layer. The four metal gates include two outer metal gates and two middle metal gates, each of the four metal gates comprising a workfunction layer and a gate oxide layer along sidewalls of the first dielectric layer. Respective source/drains are formed in-between the two outer metal gates and the two middle metal gates. A field effect (FE) inter-dielectric layer (ILD) is formed over the first dielectric layer of the four metal gates, the FE ILD comprising at least a bottom dielectric layer formed over and in contact with the first dielectric layer of the four metal gates, and a top dielectric layer formed over the bottom dielectric layer. A precision resistor is over and on the bottom dielectric layer and extending over both the two middle metal gates, the precision resistor comprises a thin-film metallic material. A hardmask material is s over and on the precision resistor within the top dielectric layer.

Example embodiment 17: The integrated circuit structure of example embodiment 16, wherein the thin-film metallic material is selected from the group comprising titanium nitride, tungsten, tantalum, tantalum nitride, titanium, aluminum, and cobalt.

Example embodiment 18: The integrated circuit structure of example embodiment 16 or 17, wherein the precision resistor has a thickness of approximately 5-10 nm.

Example embodiment 19: The integrated circuit structure of example embodiment 16, 17 or 18, further comprising a first gate contact and a second gate contact formed through the FE ILD in contact with the precision resistor, wherein the first gate contact is aligned with a first of the two middle metal gates and the second gate contact is aligned with the a second one of the two middle metal gates.

Example embodiment 20: The integrated circuit structure of example embodiment 16, 17, 18 or 19, further comprising first and second trench-shaped contacts (TCNs) formed through the FE ILD in contact with the respective source/drains.

Example embodiment 21: The integrated circuit structure of example embodiment 16, 17, 18, 19 or 20, wherein the four metal gates comprise a metal fill material selected from the group comprising metal nitrides, metal carbides, metal silicides, metal aluminides, hafnium, zirconium, tungsten, titanium, tantalum, aluminum, ruthenium, palladium, platinum, cobalt, nickel and conductive metal oxides.

Example embodiment 22: A method of fabricating a precision resistor comprises depositing a precision resistor film stack by: blanket depositing a bottom dielectric layer over at least one metal gate, and blanket depositing a metallic thin-film material over the bottom dielectric layer, followed by a blanket deposit of a hardmask material over the metallic thin-film material. The precision resistor film stack and a hard mask material are patterned and etched patterning to form the precision resistor and a hardmask, wherein the precision resistor and the hardmask are aligned over the at least one metal gate. A top dielectric layer is blanket deposited over the bottom dielectric layer and over the hardmask. A hole for at least one contact is etched through the top dielectric layer and the hardmask to the precision resistor, and the hole is filled with a metal material.

Example embodiment 23: The method of example embodiment 22, further comprising selecting the metallic thin-film material from the group comprising titanium nitride, tungsten, tantalum, tantalum nitride, titanium, aluminum, and cobalt.

Example embodiment 24: The method of example embodiment 22 or 23, further comprising forming the precision resistor to have a thickness of approximately 5-10 nm.

Example embodiment 25: The method of example embodiment 22, 23 or 24, further comprising forming the precision resistor to have any shape including a rectangle, a zigzag, round/oval and a shape including a jog.

What is claimed is:
1. An integrated circuit structure, comprising:
a non-planar transistor comprising: a plurality of metal gates above a substrate and formed in a first dielectric layer, wherein the plurality of metal gates include a first set of one or more metal gates, a second set of one or more metal gates, and a third set of one or more metal gates, the third set of one or more metal gates located between the first set of one or more metal gates and the second set of one or more metal gates, ones of the plurality of metal gates comprising a workfunction layer and a gate oxide layer along sidewalls of the first dielectric layer, and respective source/drains, the respective source/drains formed between the first set of one or more metal gates and the third set of one or more metal gates, and between the third set of one or more metal gates and the second set of one or more metal gates;
a field effect (FE) inter-dielectric layer (ILD) formed over the first dielectric layer of the plurality of metal gates, the FE ILD comprising at least a bottom dielectric layer formed over and in contact with the first dielectric layer of the plurality of metal gates, and a top dielectric layer formed over the bottom dielectric layer;

a resistor comprising a thin-film metallic material over and on the bottom dielectric layer and extending over ones of the third set of one or more metal gates; and a hardmask material over and on the resistor within the top dielectric layer.

2. The integrated circuit structure of claim 1, wherein the thin-film metallic material is selected from the group comprising titanium nitride, tungsten, tantalum, tantalum nitride, titanium, aluminum, and cobalt.

3. The integrated circuit structure of claim 1, wherein the precision resistor has a thickness of approximately 5-10 nm.

4. The integrated circuit structure of claim 1, further comprising a first gate contact and a second gate contact formed through the FE ILD in contact with the precision resistor, wherein the first gate contact is aligned with a first one of the third set of one or more metal gates and the second gate contact is aligned with a second one of the third set of one or more metal gates.

5. The integrated circuit structure of claim 1, further comprising first and second trench-shaped contacts (TCNs) formed through the FE ILD in contact with the respective source/drains and a gate contact (GCN) formed through the FE ILD in contact with a first one of the first set of one or more metal gates.

6. The integrated circuit structure of claim 1, wherein the plurality of metal gates comprise a metal fill material selected from the group comprising metal nitrides, metal carbides, metal silicides, metal aluminides, hafnium, zirconium, tungsten, titanium, tantalum, aluminum, ruthenium, palladium, platinum, cobalt, nickel and conductive metal oxides.

* * * * *